United States Patent
Grealish et al.

(10) Patent No.: US 7,702,981 B2
(45) Date of Patent: Apr. 20, 2010

(54) STRUCTURAL TESTING USING BOUNDARY SCAN TECHNIQUES

(75) Inventors: James Grealish, Beaverton, OR (US); Dave F. Dubberke, Aloha, OR (US); Milo J. Juenemann, Hillsboro, OR (US); Christopher J. Koza, Tempe, AZ (US); Eric T. Fought, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 334 days.

(21) Appl. No.: 11/693,548

(22) Filed: Mar. 29, 2007

(65) Prior Publication Data
US 2008/0244343 A1 Oct. 2, 2008

(51) Int. Cl.
*G01R 31/28* (2006.01)

(52) U.S. Cl. .................. 714/727; 714/724; 714/729; 714/732; 714/735; 714/736; 714/742; 714/726; 714/25; 714/30; 714/32; 714/709; 714/718; 365/201

(58) Field of Classification Search .................. None
See application file for complete search history.

(56) References Cited

U.S. PATENT DOCUMENTS

| | | | |
|---|---|---|---|
| 5,498,964 A * | 3/1996 | Kerschner et al. | 324/530 |
| 6,286,119 B1 * | 9/2001 | Wu et al. | 714/726 |
| 7,174,492 B1 * | 2/2007 | Chung et al. | 714/727 |
| 7,234,088 B2 * | 6/2007 | Gass | 714/725 |
| 7,269,770 B1 * | 9/2007 | Chung et al. | 714/727 |
| 7,451,370 B2 * | 11/2008 | Whetsel | 714/727 |
| 2001/0014959 A1 * | 8/2001 | Whetsel | 714/724 |
| 2004/0181729 A1 * | 9/2004 | Whetsel | 714/742 |
| 2005/0035753 A1 * | 2/2005 | Abdennadher | 324/158.1 |
| 2007/0234155 A1 * | 10/2007 | Whetsel | 714/727 |

* cited by examiner

*Primary Examiner*—John P Trimmings
(74) *Attorney, Agent, or Firm*—Blakely, Sokoloff, Taylor & Zafman LLP

(57) ABSTRACT

A boundary scan technique to generate toggling waveform such as a square wave signal to perform structural testing is disclosed. An instr_extesttoggle command is provided that enables IEEE 1149.1 boundary scan cell to selectively generate the toggling signal on the pre-specified output pads of the integrated circuit. The frequency of the toggling signal may be controlled by the JTAG clock signal and the frequency of the toggling signal may be independent of the length of the boundary scan chain. Such an approach circumvents provisioning test points on the interconnects of a printed circuit board.

15 Claims, 2 Drawing Sheets

STRUCTURAL TESTING USING BOUNDARY SCAN TECHNIQUES

BACKGROUND

Electronic systems comprise high density interconnect (HDI) printed circuit boards (PCB). In one embodiment, the PCB may comprise signal paths (tracks) and provision for mounting integrated circuits and electronic components. The components of the electronic system are structurally tested to determine whether the components operate as desired. One such structural test may comprise a capacitive plate testing. In the capacitive plate testing, a capacitive plate may be placed on a device under test (DUT) and the tester may provide a time varying signal (e.g., 8 kilohertz sinusoidal signal) to the DUT. A measure of the capacitance between the DUT and the capacitive plate may be representative of the structural defects. To provide time varying signal from an external source, the tracks may be provided with test points. However, providing test points on the PCB's may be prohibitive due to space constraints.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

DETAILED DESCRIPTION

The following description describes a structural testing using boundary scan techniques. In the following description, numerous specific details such as logic implementations, resource partitioning, or sharing, or duplication implementations, types and interrelationships of system components, and logic partitioning or integration choices are set forth in order to provide a more thorough understanding of the present invention. It will be appreciated, however, by one skilled in the art that the invention may be practiced without such specific details. In other instances, control structures, gate level circuits, and full software instruction sequences have not been shown in detail in order not to obscure the invention. Those of ordinary skill in the art, with the included descriptions, will be able to implement appropriate functionality without undue experimentation.

References in the specification to "one embodiment", "an embodiment", "an example embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device).

For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, and digital signals). Further, firmware, software, routines, and instructions may be described herein as performing certain actions. However, it should be appreciated that such descriptions are merely for convenience and that such actions in fact result from computing devices, processors, controllers, and other devices executing the firmware, software, routines, and instructions.

Figure 1:
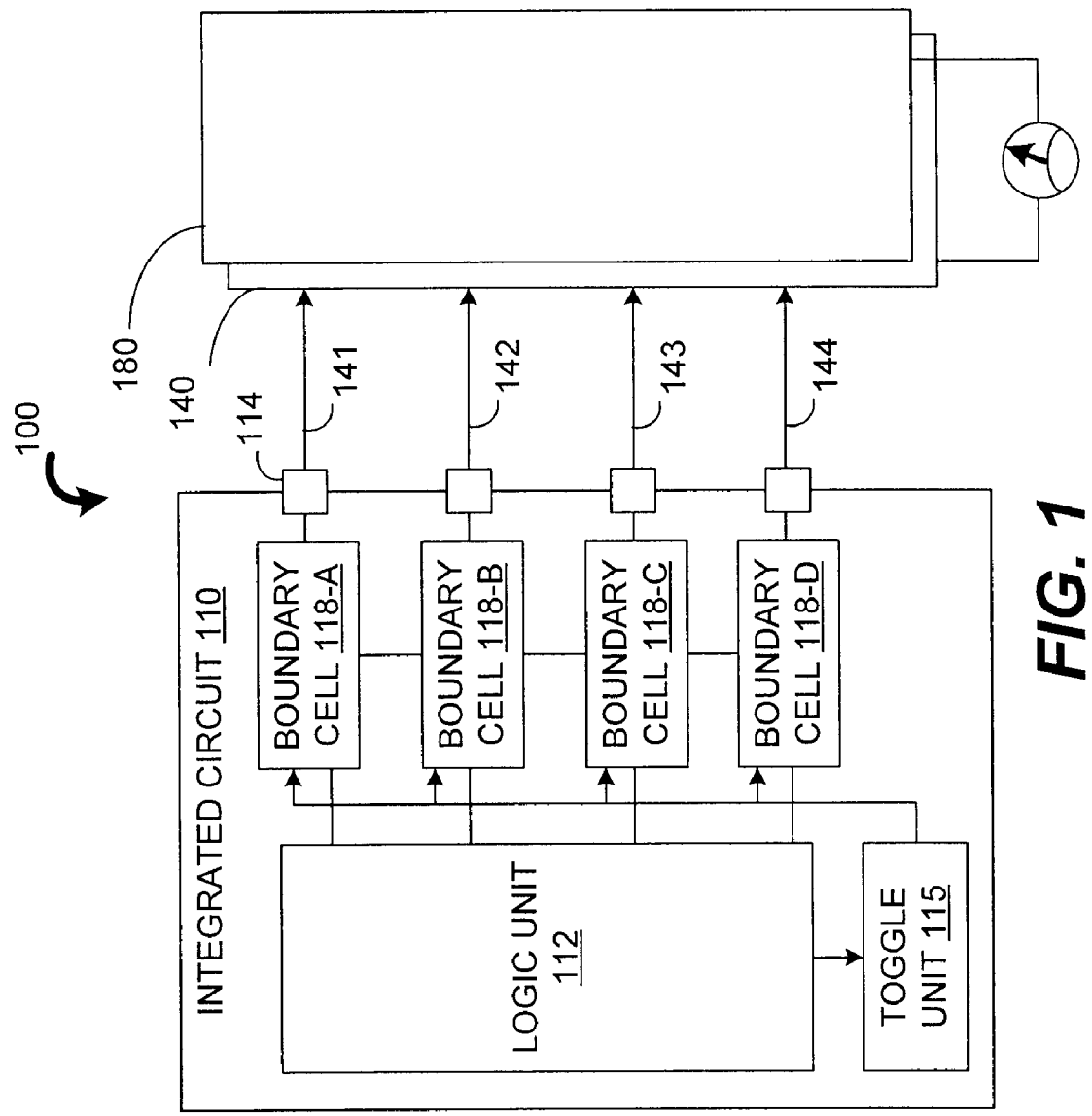
FIG. 1 illustrates an embodiment of a test environment 100.

An embodiment of a test environment 100 is illustrated in FIG. 1. The test environment 100 may comprise an integrated circuit 110, device under test (DUT) 140, and a plate 180. In one embodiment, the test procedure may be referred to as 'capacitive plate method'.

In one embodiment, the plate 180 may be placed above the DUT 140 and a signal may be provided to the DUT 140. In one embodiment, the capacitance may be measured between the DUT 140 and the plate 180. The capacitance value read on a capacitance meter may indicate the presence of the structural defects.

In one embodiment, the integrated circuit 110 may comprise a logic unit 112, toggle unit 115, boundary cells 118-A to 118-D, and I/O pads 114. In one embodiment, the integrated circuit 110 may represent a memory controller hub (MCH) and the DUT 140 may represent a DIMM socket. In one embodiment, the logic 112 may comprise hardware, software, and firmware components to perform a pre-specified task. In one embodiment, the DUT 140 may be tested to determine the presence of structural defects such as a dry solder, or open circuit of the tracks, or discontinuity in the socket pins, or pins shorted together.

In one embodiment, the boundary scan cells may be designed based on the IEEE standard Test Access Port and Boundary scan Architecture (IEEE Std 1149.1). In one embodiment, a instr_extesttoggle command may be used to generate a toggling signal such as a square wave signal. In one embodiment, the square wave signal may be used to perform structural testing. Such an approach may circumvent the test points being provided on the tracks 141-144. An instr_extesttoggle command may enable IEEE boundary scan cells 118-A to 118-D to selectively generate the toggling signal on the pre-specified output pads such as 114 of the integrated circuit 110. Such an approach may circumvent provisioning of test points in printed circuit boards.

In one embodiment, the toggle unit 115 may generate a square wave signal, which may be provided to each of the boundary scan cells 118. In one embodiment, the frequency of the square wave signal may equal 8 kilohertz. In one embodiment, the toggle unit 115 may receive one or more control signals from the logic unit 112. In one embodiment, the control signals may comprise the instr_extesttoggle command, which may cause the toggle unit 115 to generate a square wave signal. In one embodiment, the control signal may also include JTAG clock signal (TCLK) and the frequency of square wave signal may be controlled by the frequency of the clock signal TCLK. In one embodiment, the frequency of the square wave signal generated by the toggle unit 115 may be independent of the length of the boundary-scan chain.

As the toggle unit 115 may generate square wave of 8 khz for example, the tester may not be required to generate and source the square wave signal. Such an approach may enable using of the existing capacitive plate apparatus and method for structural testing without provisioning the test points on the high density interconnects and without the tester having to generate the square wave signal.

In one embodiment, the boundary scan cells 118 may be provisioned between the output points of the logic unit 112 and the output pads 114. In one embodiment, each boundary cell 118 may comprise a plurality of logic elements, which may be provided with a plurality of input signals. In one embodiment, test logic may be used to generate the plurality of input signals that may comprise combination of input values and control signal values. In one embodiment, the output signals generated by each boundary cell 118 may be used to determine if the DUT 140 and the tracks between the DUT 140 and the integrated circuit 110 is functioning as desired.

In one embodiment, while testing the track 141 and the socket pin of the DUT 140 coupled to the track 141, logic 1 may be provided to the boundary scan cell 118-A while logic 0 is provided as the inputs to the boundary cells 118-B, 118-C, and 118-D. In one embodiment, the boundary scan cells 118-A to 118-D may receive a square wave signal from the toggle unit 115. However, only the boundary scan cell 118-A may transfer the square wave signal on the track 141 and the boundary scan cells 118-B to 118-D may provide logic 0 on the tracks 142-144 respectively.

In one embodiment, while the boundary scan cell 118-A is transferring the square wave signal on the track 141, the signal on other tracks may be held at logic zero to avoid interference. After the track 141 and the portion of the DUT 140 such a pin of the DIMM socket coupled to the track 141 is tested, logic 1 may be provided as an input to the boundary scan cell 118-B while logic 0 is provided as inputs to the boundary scan cells 118-A, 118-C, and 118-D. As a result, the boundary scan cell 118-B may transfer the square wave signal on the track 142. Likewise, the square wave signal may be transferred on the track 143 by providing logic 1 as an input to the boundary scan cell 118-C while the other boundary scan cells 118-A, 118-B, and 118-D may transfer logic zero on the tracks 141, 142, and 144 respectively. Such an approach may provide a selective pin-by-pin control over the pads 114 that are toggled.

Figure 2:
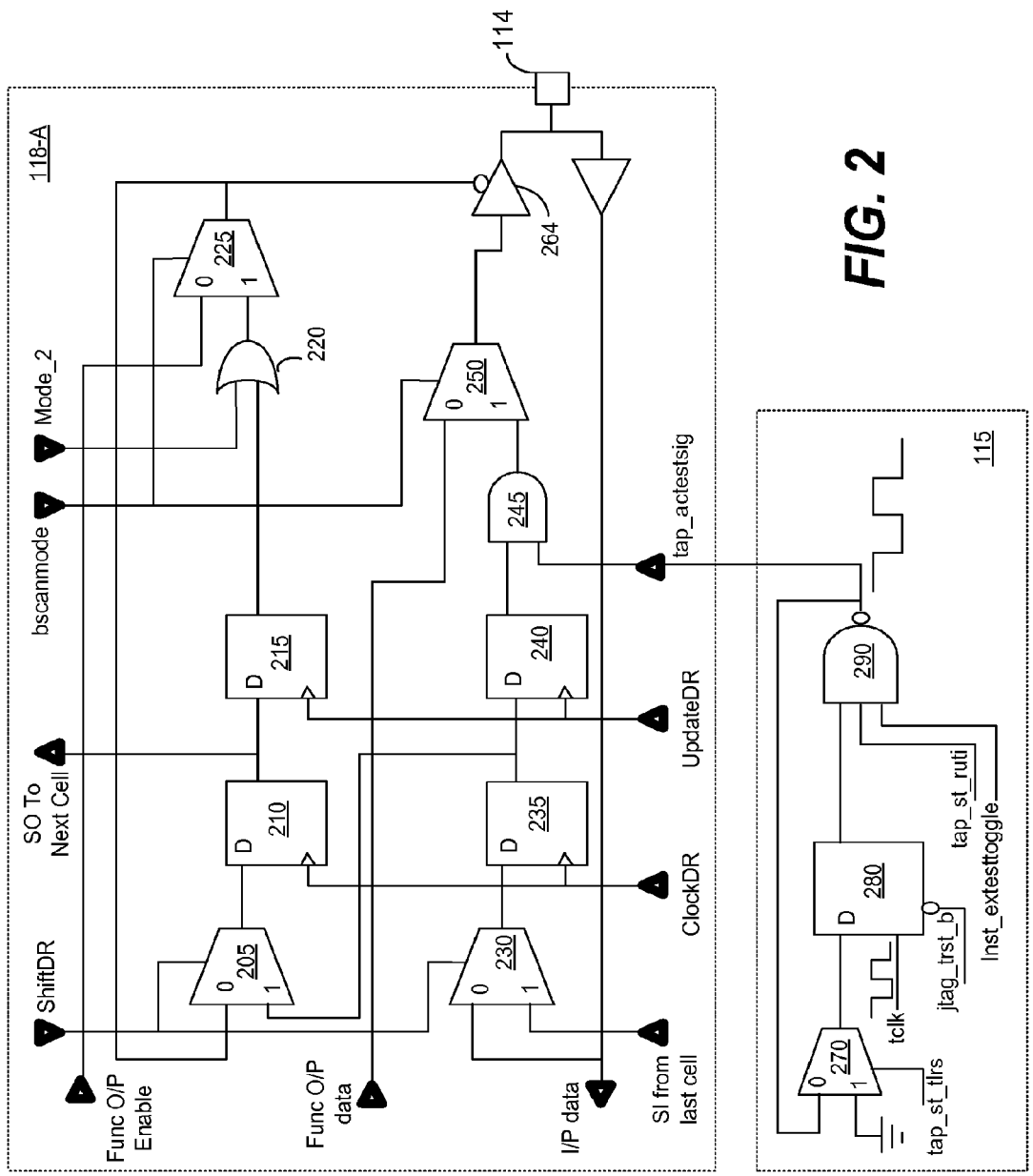
FIG. 2 illustrates an embodiment of a boundary scan cell and a toggle unit, which together is used to perform structural testing.

An embodiment of the boundary cell 118-A and the toggle unit 115 is depicted in FIG. 2. The toggle unit 115 may comprise a multiplexer (MUX) 270, a flip-flop (FF) 280, and a NAND gate 290. In one embodiment, a first input to the MUX 270 may be coupled to the output of the NAND gate 290 and the second input to the ground level (=0). A first control signal tap_st_tlrs may be provided to the select input of the MUX 270. The output of the MUX 270 may be provided as 'D' input to the FF 280. A clock signal TCLK of frequency 'F' Hz may be provided on the clk input and a second control signal jtag_trst_b on the reset input of the FF 280. The output of the FF 280 may be provided as a first input to the NAND gate 290. The second and third inputs of the NAND gate 290 may be coupled, respectively, to a third (tap_st_ruti) and a fourth (instr_extesttoggle) control signal. The output of the NAND gate 290 is provided as an input to the AND gate 245 of the boundary scan cell 118-A.

The boundary scan cell 118-A may comprise two multiplexers MUX 205 and MUX 230 at the input stage and MUX 225 and MUX 250 at the output stage, two flip-flops FF 210 and FF 235 in the capture stage, two flip-flops FF 215 and FF 240 in the update stage, and an OR gate 220 and AND gate 245 between the update and the output stage. The MUX 205 and 225, FF's 210 and 215, and the OR gate 220 together may control enabling of the output buffer 264. The MUX 230 and 250, FF's 235 and 240, and the AND gate 245 may provide a signal to the output pad 114 through the output buffer 264.

During a typical test mode of operation, the tap_st_trls is held at logic 1 and as a result the output of the NAND gate 290 may be held at logic 1. The AND gate 245 may receive a logic 1 on the tap-actestsigb input from the toggle unit 115. The Mux 230, FF235, FF240, AND gate 245, and Mux 250 together may transfer the signal input (SI) from the previous boundary scan cell to the output pad 114 through the output buffer 264. Such a transfer may be controlled by the control signals ShiftDR, ClockDR, UpdateDR, and bscanmode provided to the Mux 230, FF235, FF240, and Mux 250 respectively.

During the toggle mode, to generate a square wave signal, the tap_st_tlrs is held at logic 0, the jtag_trst_b, instr_extesttoggle, and tap_st_ruti is held at logic 1. The Mux 270 transfers the input (e.g., logic 1) received from the NAND gate 290 to the D input of the FF 280. In response to receiving a rising edge of the clock TCLK, the FF 280 transfers the logic 1 to the first input of NAND gate 290. The NAND gate 290 generates a logic 0 on the output, which is provided as the tap_actestsigb input of the AND gate 245.

In response to receiving a next rising edge of the clock TCLK, the FF 280 transfers logic 0 to the input of the NAND gate 290 and the NAND gate 290 generates logic 1 on the output. As the output of the NAND gate 290 is fed back to the input of the Mux 270, the output of the NAND gate 290 toggles from logic 1 to logic 0 and logic 0 to logic 1 at a frequency equaling half (½) of the clock TCLK.

In one embodiment, the AND gate 245 may receive a square wave signal on the tap-actestsigb input from the toggle unit 115. The AND gate 245 and the MUX 250 may transfer the square wave signal to the output pad 114 via the output buffer 264. In one embodiment, the square wave signal provided on the output pad 114 may be transmitted on the track 141, which couples the output pad 114 to the pin of the DUT 140. As a result of applying the square wave signal to the pin of the DUT 140, the capacitance meter coupled to the DUT 140 and the plate 180 indicates a value, which may be used to determine the presence of the structural defects in the track 141 and the pin of the DUT 140 coupled to the track 141. However, as the input signal for the other boundary scan cells 118-B to 118-D may equal zero and as a result, the signal on the tracks 142-144 may also equal zero. Such an approach may avoid interference of signals transmitted on the tracks 141-144.

By adding the AND gate 245 to each of the boundary scan cells 118 and by provisioning a toggle unit 115 that may provide the square wave signal to all the boundary scan cells 118. The selective pin-by-pin control may enable one of the boundary scan cells 118 to generate the toggling signal on the track coupled to that boundary scan cell, while the other boundary scan cells 118 may transfer logic zero. Such an approach may minimize the length of the boundary scan chain, which may reduce the test time. Also, such an approach may simplify the test code by allowing the test programmer to easily turn ON/OFF the toggling wave form.

Certain features of the invention have been described with reference to example embodiments. However, the description is not intended to be construed in a limiting sense. Various modifications of the example embodiments, as well as other embodiments of the invention, which are apparent to persons skilled in the art to which the invention pertains are deemed to lie within the spirit and scope of the invention.

What is claimed is:

1. An apparatus comprising:
   a logic unit to issue a toggle command to start testing a device under test,
   a toggle unit coupled to the logic unit, wherein the toggle unit is to generate a toggling signal in response to receiving the toggle command, and
   a plurality of boundary scan cells comprising a first boundary scan cell and a second boundary scan cell coupled to the toggle unit and the logic unit,
   wherein the first boundary scan cell is to transfer the toggling signal on a first signal path during a first duration in response to receiving the toggling signal and a first signal from the logic unit and the second boundary scan cell is to inhibit the transfer of the toggling signal on a second signal path coupled to the second boundary scan cell during the first duration in response to receiving the toggling signal and a second signal from the logic unit, wherein the toggling signal transferred on the first signal path is used to test at least a portion of a device under test, wherein the first signal path does not comprise a test point to provide the toggling signal,
   wherein the toggling unit further comprises
   a multiplexer comprising a first input, a second input, a select input, and a first output, a flip-flop comprising a data input, a test input, a control input, and a second output, wherein the data input is coupled to the first output, and a logic gate comprising a third, fourth, and a fifth input and a third output, wherein the third input is coupled to the second output, wherein the logic gate is to generate the toggling signal on the third output in response to a test clock signal provided on the test input of the flip-flop, a first logic value on the select input of the multiplexer, and a second logic value provided on the control input of the flip-flop and the third and fourth input of the logic gate.

2. The apparatus of claim 1, wherein the toggling signal is generated at a frequency that is controlled by the test clock signal.

3. The apparatus of claim 2, wherein the frequency of the toggling signal is independent of the length of the boundary scan chain.

4. The apparatus of claim 2, wherein the frequency of the toggling signal equals half the frequency of the test clock signal.

5. The apparatus of claim 1 further comprises the second boundary scan cell coupled to the toggle unit, wherein the second boundary cell is to transfer a logical zero on the second signal path during the first duration in response to receiving the toggling signal.

6. The apparatus of claim 5, wherein the first boundary scan cell is to transfer logical zero on the first signal path during a second duration in response to receiving the toggling signal.

7. The apparatus of claim 5, wherein the second boundary scan cell is to transfer the toggling signal on the second signal path during the second duration in response to receiving the toggling signal.

8. A test system comprising:
   an integrated circuit to generate a toggling signal, wherein the integrated circuit is to transfer the toggling signal on a first signal path during a first duration and to inhibit the transfer of the toggling signal on a second signal path during the first duration, wherein the first signal path and the second signal path does not comprise a test point
   a device under test coupled to the integrated circuit by a plurality of signal paths, wherein the plurality of signal paths comprise the first signal path and the second signal path,
   a capacitive plate coupled to the device under test, and
   a capacitance meter coupled to the device under test and the capacitive plate, wherein the capacitance meter is to provide a reading that is representative of the structural defects in the first signal path and at least a portion of the device under test in response to receiving the toggling signal,
   wherein the integrated circuit further comprises a toggle unit, wherein the toggle unit is to include
   a multiplexer comprising a first input, a second input, a select input, and a first output, a flip-flop comprising a data input, a test input, a control input, and a second output, wherein the data input is coupled to the first output, and a logic gate comprising a third, fourth, and a fifth input and a third output, wherein the third input is coupled to the second output, wherein the logic gate is to generate the toggling signal on the third output in response to a test clock signal provided on the test input of the flip-flop, a first logic value on the select input of the multiplexer, and a second logic value provided on the control input of the flip-flop and the third and fourth input of the logic gate.

9. The test system of claim 8, wherein the integrated circuit further comprises:
   a logic unit, wherein the logic unit is to generate a toggle command to start testing of the device under test,
   the toggle unit coupled to the logic unit, wherein the toggle unit is to generate the toggling signal in response to receiving the toggle command, and
   a first boundary cell coupled to the toggle unit and the first signal path, wherein the first boundary cell is to transfer the toggling signal on the first signal path during the first duration.

10. The test system of claim 9 the integrated circuit further comprises a second boundary cell coupled to the toggle unit and a second signal path, wherein the second boundary cell is to transfer a logical zero on the second signal path in the first duration in response to receiving the toggling signal.

11. The test system of claim 10, wherein the second boundary cell is to transfer the toggling signal on the second signal path in the second duration in response to receiving the toggling signal.

12. The test system of claim 9, wherein the first boundary cell is to transfer a logical zero on the first signal path in a second duration in response to receiving the toggling signal.

13. The test system of claim 9, wherein the logic unit is to generate a test clock signal of a first frequency, wherein the first frequency of the test clock signal is to determine the frequency of the toggling signal.

14. The test system of claim 8, wherein the capacitance between the device under test and the capacitance plate during the first duration is to indicate the presence of the structural defects in a first portion of the device under test and the first signal path.

15. The test system of claim 8, wherein the capacitance between the device under test and the capacitance plate during the second duration is to indicate the presence of the structural defects in a second portion of the device under test and the second signal path.

* * * * *